US010068894B2

(12) United States Patent
Zhao et al.

(10) Patent No.: US 10,068,894 B2
(45) Date of Patent: Sep. 4, 2018

(54) LOW LEAKAGE BIDIRECTIONAL CLAMPS AND METHODS OF FORMING THE SAME

(71) Applicant: Analog Devices, Inc., Norwood, MA (US)

(72) Inventors: James Zhao, San Francisco, CA (US); Javier Alejandro Salcedo, North Billerica, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/594,394

(22) Filed: Jan. 12, 2015

(65) Prior Publication Data

US 2016/0204096 A1 Jul. 14, 2016

(51) Int. Cl.
*H01L 27/02* (2006.01)
*H01L 21/8222* (2006.01)
(Continued)

(52) U.S. Cl.
CPC ...... *H01L 27/0262* (2013.01); *H01L 21/8222* (2013.01); *H01L 28/20* (2013.01);
(Continued)

(58) Field of Classification Search
CPC ............. H01L 2924/00; H01L 27/0259; H01L 2924/0002; H01L 2224/48091; H01L 27/0262
See application file for complete search history.

(56) References Cited

U.S. PATENT DOCUMENTS 3,436,667 A    4/1969 Kedson
4,331,884 A    5/1982 Svedberg
(Continued)

FOREIGN PATENT DOCUMENTS

CN    103839941 A    6/2014
CN    104164414 A    11/2014
(Continued)

OTHER PUBLICATIONS

Salcedo et al., Bidirectional Devices for Automotive-Grade Electrostatic Discharge Applications, IEEE Electron Device Letters, vol. 33, No. 6, Jun. 2012, 3 pages.
(Continued)

*Primary Examiner* — Tony Tran
(74) *Attorney, Agent, or Firm* — Knobbe Martens Olson & Bear LLP

(57) ABSTRACT

Low leakage bidirectional clamps and methods of forming the same are provided. In certain configurations, a bidirectional clamp includes a first p-well region, a second p-well region, and an n-well region positioned between the first and second p-wells regions. The bidirectional clamp further includes two or more oxide regions over the n-well region, and one or more n-type active (N+) dummy blocking current regions are positioned between the oxide regions. The one or more N+ dummy leakage current blocking regions interrupt an electrical path from the first p-type well region to the second p-type well region along interfaces between the n-well region and the oxide regions. Thus, even when charge accumulates at the interfaces due to extended high voltage, e.g., >60V, and/or high temperature operation (e.g., >125° C.), the N+ dummy leakage current blocking regions inhibit charge trapping-induced leakage current.

22 Claims, 10 Drawing Sheets

(51) Int. Cl.
*H01L 49/02* (2006.01)
*H01L 29/06* (2006.01)
*H01L 29/10* (2006.01)
*H03K 17/567* (2006.01)
*H01L 29/861* (2006.01)

(52) U.S. Cl.
CPC ...... *H01L 29/0638* (2013.01); *H01L 29/1095* (2013.01); *H01L 29/861* (2013.01); *H03K 17/567* (2013.01); *H01L 29/0649* (2013.01)

(56) References Cited

U.S. PATENT DOCUMENTS

| | | |
|---|---|---|
| 4,633,283 A | 12/1986 | Avery |
| 5,061,652 A | 10/1991 | Bendernagel et al. |
| 5,276,582 A | 1/1994 | Merrill et al. |
| 5,341,005 A | 8/1994 | Canclini |
| 5,343,053 A | 8/1994 | Avery |
| 5,369,041 A | 11/1994 | Duvvury |
| 5,541,801 A | 7/1996 | Lee et al. |
| 5,576,557 A | 11/1996 | Ker et al. |
| 5,615,074 A | 3/1997 | Avery |
| 5,652,689 A | 7/1997 | Yuan |
| 5,663,860 A | 9/1997 | Swonger |
| 5,742,084 A | 4/1998 | Yu |
| 5,745,323 A | 4/1998 | English et al. |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,940 A | 4/1999 | Kim |
| 5,998,813 A | 12/1999 | Bernier |
| 6,097,068 A | 8/2000 | Brown et al. |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,784,489 B1 | 8/2004 | Menegoli |
| 6,870,202 B2 | 3/2005 | Oka |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,285,828 B2 | 10/2007 | Salcedo et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,217,461 B1 | 7/2012 | Chu et al. |
| 8,222,698 B2 | 7/2012 | Salcedo et al. |
| 8,320,091 B2 | 11/2012 | Salcedo et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,422,187 B2 | 4/2013 | Parthasarathy et al. |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,564,065 B2 | 10/2013 | Donovan et al. |
| 8,592,860 B2 | 11/2013 | Salcedo et al. |
| 8,610,251 B1 | 12/2013 | Salcedo |
| 8,633,509 B2 | 1/2014 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,772,091 B2 | 7/2014 | Salcedo et al. |
| 8,796,729 B2 | 8/2014 | Clarke et al. |
| 8,829,570 B2 | 9/2014 | Salcedo et al. |
| 8,860,080 B2 | 10/2014 | Salcedo et al. |
| 8,890,248 B2 | 11/2014 | Pauletti et al. |
| 8,946,822 B2 | 2/2015 | Salcedo et al. |
| 8,947,841 B2 | 2/2015 | Salcedo et al. |
| 8,958,187 B2 | 2/2015 | Parthasarathy et al. |
| 8,963,200 B2 | 2/2015 | Lee et al. |
| 9,006,781 B2 | 4/2015 | Salcedo et al. |
| 9,006,782 B2 | 4/2015 | Salcedo |
| 9,088,256 B2 | 7/2015 | Cosgrave et al. |
| 9,123,540 B2 | 9/2015 | Salcedo et al. |
| 9,147,677 B2 | 9/2015 | Salcedo et al. |
| 9,171,832 B2 | 10/2015 | Salcedo et al. |
| 9,275,991 B2 | 3/2016 | Salcedo et al. |
| 9,293,912 B2 | 3/2016 | Parthasarathy et al. |
| 9,478,608 B2 | 10/2016 | Salcedo et al. |
| 9,634,482 B2 | 4/2017 | Parthasarathy et al. |
| 2001/0040254 A1 | 11/2001 | Takiguchi |
| 2002/0021538 A1 | 2/2002 | Chen et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2004/0135229 A1 | 7/2004 | Sasahara |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0133869 A1 | 6/2005 | Ker et al. |
| 2005/0151160 A1 | 7/2005 | Salcedo et al. |
| 2005/0173727 A1 | 8/2005 | Manna et al. |
| 2005/0195540 A1 | 9/2005 | Streibl et al. |
| 2005/0269641 A1 | 12/2005 | Lai et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0151836 A1 | 7/2006 | Salcedo et al. |
| 2006/0186467 A1 | 8/2006 | Pendharkar et al. |
| 2007/0007545 A1 | 1/2007 | Salcedo et al. |
| 2007/0058307 A1 | 3/2007 | Mergens et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2009/0032838 A1 | 2/2009 | Tseng et al. |
| 2009/0034137 A1 | 2/2009 | Disney et al. |
| 2009/0045457 A1 | 2/2009 | Bodbe |
| 2009/0057715 A1 | 3/2009 | Ryu et al. |
| 2009/0206376 A1 | 8/2009 | Mita et al. |
| 2009/0230426 A1 | 9/2009 | Carpenter et al. |

(56) References Cited

U.S. PATENT DOCUMENTS

| | | |
|---|---|---|
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0207409 A1 | 8/2011 | Ker et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0199874 A1 | 8/2012 | Salcedo et al. |
| 2012/0205714 A1 | 8/2012 | Salcedo et al. |
| 2012/0211869 A1 | 8/2012 | Lee et al. |
| 2012/0293904 A1 | 11/2012 | Salcedo et al. |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |
| 2014/0339601 A1 | 11/2014 | Salcedo et al. |
| 2014/0346563 A1 | 11/2014 | Salcedo et al. |
| 2015/0076557 A1 | 3/2015 | Salcedo et al. |
| 2016/0141358 A1 | 5/2016 | Salcedo et al. |
| 2016/0204096 A1 | 7/2016 | Zhao et al. |
| 2016/0261110 A1 | 9/2016 | Ivanov et al. |
| 2016/0285255 A1 | 9/2016 | O'Donnell et al. |
| 2016/0300830 A1 | 10/2016 | Salcedo et al. |
| 2016/0336740 A1 | 11/2016 | Parthasarathy et al. |
| 2016/0336744 A1 | 11/2016 | Parthasarathy et al. |
| 2017/0256534 A1 | 9/2017 | Parthasarathy et al. |
| 2017/0317070 A1 | 11/2017 | Salcedo et al. |

FOREIGN PATENT DOCUMENTS

| | | |
|---|---|---|
| CN | 104341272 A | 2/2015 |
| DE | 10 2007 040 875 A1 | 3/2009 |
| EP | 0 168 678 A2 | 1/1986 |
| EP | 0 915 508 A1 | 5/1999 |
| EP | 1 703 560 A2 | 9/2006 |
| KR | 10-2006-0067100 | 2/2006 |
| KR | 10-2009-0123683 | 12/2009 |
| KR | 10-2010-0003569 | 1/2010 |

OTHER PUBLICATIONS

Anderson et al., ESD Protection under Wire Bonding Pads, EOS/ESD Symposium 99-88, pp. 2A.4.1-2A.4.7 (1999).

Luh et al. A Zener-Diode-Activated ESD Protection Circuit for Sub-Micron CMOS Processes, Circuits and Systems, IEEE International Symposium, May 28-31, 2000, Geneva, Switzerland, 4 pages.

Salcedo et al., Electrostatic Discharge Protection Framework for Mixed-Signal High Voltage CMOS Applications, IEEE Xplore, downloaded Feb. 23, 2010 at 12:53 EST, 4 pages.

Chang et al., High-k Metal Gate-bounded Silicon Controlled Rectifier for ESD Protection, 34th Electrical Overstress/Electrostatic Discharge Symposium, Sep. 2012, 7 pages.

Salcedo et al., On-Chip Protection for Automotive Integrated Circuits Robustness, 2012 8th International Caribbean Conference on Devices, Circuits and Systems (ICCDCS), 5 pages, Mar. 2012.

Chia-Tsen Dai, Ming-Dou Ker, IEEE International Conference on Microelectronic Test Structures (ICMTS), 4 pages, Mar. 2013.

R. Rudolf, C. Wagner, L. O'Riain, K. Gebhardt, B. Kuhn-Heinrich, B. von Ehrenwall, A. von Ehrenwall, M. Strasser, M. Stecher, U. Glaser, S. Aresu, P. Kuepper, A. Mayerhofer, IEEE International Symposium on Power Semiconductor Devices and ICs, 4 pages, May 2011.

Petr Betak: "An Advanced SCR Protective Structure Against ESD Stress". Proceedings of the 13th Conference Student EEICT 2007, vol. 4, Jan. 2007, pp. 286-290.

Xi et al. "Design and Characterization of ESD Solutions with EMC Robustness for Automotive Applications", Microelectronics Reliability 55 (2015) 2236-2246.

Electrical Technololgy; How to Determine the Number of Nodes, Branches, Loops and Meshes in a Circuit?, retrieved from the Internet <URL: http://www.electricaltechnology.org/2013/12/determine-the-number-of-Nodes-Branches-Loops-and-Meshes-in-Circuit.html>; Dec. 27, 2012; retrieved on Jul. 5, 2017.

Chinese Office Action Issued for Application No. 201610013897.0 dated Apr. 16, 2018, in 8 pages.

LOW LEAKAGE BIDIRECTIONAL CLAMPS AND METHODS OF FORMING THE SAME

BACKGROUND

Field

Embodiments of the invention relate to electronic systems, and more particularly, to bidirectional clamps for integrated circuits (ICs).

Description of the Related Technology

Certain electronic systems can be exposed to a transient electrical event, or an electrical signal of a relatively short duration having rapidly changing voltage and high power. Transient electrical events can include, for example, electrostatic discharge (ESD) events and/or electromagnetic interference (EMI) events.

Transient electrical events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage, and surface charge accumulation. Moreover, transient electrical events can induce latch-up (in other words, inadvertent creation of a low-impedance path), thereby disrupting the functioning of the IC and potentially causing permanent damage to the IC. Thus, there is a need to provide an IC with protection from such transient electrical events, such as during IC power-up and power-down conditions.

SUMMARY

In one aspect, a bidirectional clamp for a high voltage interface is provided. The bidirectional clamp includes a semiconductor substrate, a first well region of a first conductivity type in the semiconductor substrate, a second well region of the first conductivity type in the semiconductor substrate, and a third well region of a second conductivity type opposite the first conductivity type in the semiconductor substrate. At least a portion of the third well region is positioned between the first well region and the second well region. The bidirectional clamp further includes a plurality of oxide regions over the third well region, and the plurality of oxide regions and the third well region meet at a plurality of oxide-semiconductor interfaces. The bidirectional clamp further includes an anti-inversion ring structure of the second conductivity type in the third well region. The anti-inversion ring structure is configured to inhibit charge trapping-induced leakage current by interrupting an electrical path from the first well region to the second well region along the plurality of oxide-semiconductor interfaces.

In another aspect, an integrated circuit is provided. The integrated circuit includes a semiconductor substrate, an input port, and a bidirectional clamp including a first terminal electrically connected to the input port and a second terminal electrically connected to a power low supply voltage. The bidirectional clamp includes a first well region of a first conductivity type in the semiconductor substrate, a second well region of the first conductivity type in the semiconductor substrate, and a third well region of a second conductivity type opposite the first conductivity type in the semiconductor substrate. At least a portion of the third well region is positioned between the first well region and the second well region. The bidirectional clamp further includes a plurality of oxide regions over the third well region, and the plurality of oxide regions and the third well region meet at a plurality of oxide-semiconductor interfaces. The bidirectional clamp further includes an anti-inversion ring structure of the second conductivity type in the third well region. The anti-inversion ring structure is configured to inhibit charge trapping-induced leakage current between the input port and the power low supply voltage by interrupting an electrical path from the first well region to the second well region along the plurality of oxide-semiconductor interfaces.

In another aspect, a method of making a bidirectional clamp is provided. The method includes forming a first well region of a first conductivity type in a semiconductor substrate, forming a second well region of the first conductivity type in the semiconductor substrate, and forming a third well region of a second conductivity type opposite the first conductivity type in the semiconductor substrate. At least a portion of the third well region is positioned between the first well region and the second well region. The method further includes forming an anti-inversion ring structure of the second conductivity type in the third well region, and forming a plurality of oxide regions over the third well region. The plurality of oxide regions and the third well region meet at a plurality of oxide-semiconductor interfaces. The anti-inversion ring structure inhibits charge trapping-induced leakage current by interrupting an electrical path from the first well region to the second well region along the plurality of oxide-semiconductor interfaces.

DETAILED DESCRIPTION OF EMBODIMENTS

Figure 1:
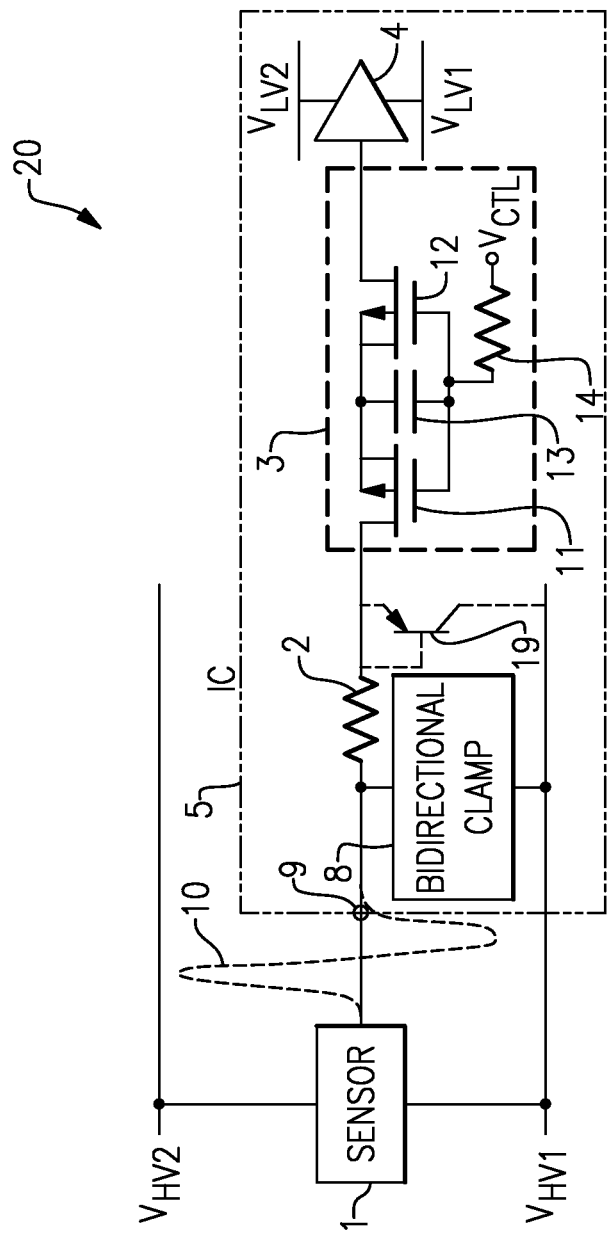
FIG. 1 is a schematic diagram of one example of a high voltage input interface and sensor system.

The following detailed description of embodiments presents various descriptions of specific embodiments of the invention. However, the invention can be embodied in a multitude of different ways as defined and covered by the claims. In this description, reference is made to the drawings in which like reference numerals indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

To help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), the Automotive Engineering Council (AEC), and the International Organization for Standardization (ISO). The standards can cover a wide multitude of transient electrical events, including electrostatic discharge (ESD) events and/or electromagnetic interference (EMI) events. To meet such standards, an integrated circuit can include protection devices.

Overview of Low Leakage Bidirectional Clamps

An electronic interface, such as the interface of a precision mixed-signal integrated circuit (IC), can include circuitry exposed to harsh operating conditions. For example, a bidirectional clamp of the IC may be operated for relatively long durations at high voltages (for example, voltages between the clamp's terminals of ±60 V or more) and/or high temperatures (for example, temperatures in the range of about 125° C. to about 200° C.).

Harsh operating conditions can shift or modify the performance of interface circuitry over time. In particular, the inventors have observed that an upward shift in standing or leakage current can occur in a bidirectional clamp over time when operating in high voltage and/or high temperature conditions. The shift in standing leakage can be induced by charges accumulating at an interface between an oxide region, such as a shallow trench isolation (STI) region, and a semiconductor region beneath the oxide region. The accumulated charge can generate an inversion layer near the oxide/semiconductor boundary, which can operate as a leakage current path between the clamp's terminals.

In certain configurations herein, a bidirectional clamp for a precision mixed-signal integrated circuit is provided. The bidirectional clamp includes a first p-well region, a second p-well region, and an n-well region positioned between the first and second p-wells regions. The first p-well region, the n-well region, and the second p-well region operate as a PNP bidirectional bipolar transistor of the bidirectional clamp. The bidirectional clamp further includes two or more oxide regions over the n-well region, and one or more n-type active (N+) dummy blocking current regions are positioned between the oxide regions.

The N+ dummy leakage current blocking regions interrupt an electrical path from the first p-type well region to the second p-type well region along oxide-semiconductor interfaces between the n-well region and the oxide regions. Thus, even when charge accumulates at the oxide-semiconductor interfaces and an inversion layer is formed due to extended high voltage and/or high temperature operation, the N+ dummy leakage current blocking regions inhibit charge trapping-induced leakage by blocking the flow of current.

Thus, the bidirectional clamp can exhibit low static power dissipation and robust off-state performance. Additionally, inclusion of the N+ dummy leakage current blocking regions can have a relatively small impact on the on-state performance of the clamp.

In certain implementations, the N+ dummy blocking current regions are implemented as part of an anti-inversion N+ ring structure. The anti-inversion N+ ring structure can include N+ dummy leakage current blocking regions implemented as rings, such as a ring in the n-type well region between the first and second p-type well regions, as a ring that surrounds a perimeter of the first p-type well region, and/or as a ring that surrounds a perimeter of the second p-type well region. In certain implementations, the anti-inversion N+ ring structure can be electrically floating, or uncontrolled by an external voltage. By electrically floating the anti-inversion N+ ring structure, the anti-inversion N+ ring structure can have substantially no impact on the blocking voltage characteristics of the bidirectional clamp. In contrast, when the anti-inversion N+ ring is contacted and controlled with an external voltage, parasitic transistor structures formed in part by the anti-inversion N+ ring structure may limit a maximum or minimum voltage that can be applied to the bidirectional clamp's terminals.

The low leakage bidirectional clamps herein can be used in a variety of applications, including for example, industrial, aeronautic, naval, energy harvesting, and/or automotive applications. The bidirectional clamps can provide a variety of functions, including, for example, operating as switches in parametric sensing control and/or signal processing designs. By integrating parametric sensing and/or high voltage signals processing in a single IC, superior process control, energy efficiency optimization, and/or prompt fault-condition correction can be achieved.

The bidirectional clamps herein can be fabricated in a variety of manufacturing processes, including, but not limited to, advanced high voltage junction-isolated BCD (Bipolar-CMOS-DMOS) processes.

FIG. 1 is a schematic diagram of one example of a high voltage input interface and sensor system 20. The high voltage input interface and sensor system 20 includes a sensor 1, and an integrated circuit or semiconductor die 5. The IC 5 includes a resistor 2, a switching circuit 3, a low voltage amplifier 4, a bidirectional clamp 8, and an interface port 9, which can correspond to a pin or pad of the IC 5.

Although FIG. 1 illustrates the IC 5 as including certain components, the IC 5 typically includes additional ports and other circuitry. These details have been omitted from FIG. 1 for clarity.

The illustrated sensor 1 is powered using a high voltage power high supply $V_{HV2}$ and a high voltage power low supply $V_{HV1}$. In certain configurations, a voltage difference between the high voltage power high supply $V_{HV2}$ and the high voltage power low supply $V_{HV1}$ is 60 V or more. The sensor 1 generates a sensor signal 10, which is provided to the interface port 9 of the IC 5.

The sensor 1 can correspond to a variety of sensor types, including, for example, a parametric sensor that generates the sensor signal 10 for a control unit implemented on the IC 5. In such a configuration, the amplitude of the sensor signal 10 can vary in response to normal variations, such as temperature variations, associated with the harsh operating environment. Such disturbances can result in relatively high voltage swing signals, for example, ±30 V, regularly reaching regularly the IC's interface port 9. Including the bidirectional clamp 8 can help prevent high voltage conditions at the interface port 9 and/or limit large currents from flowing into or out of the interface port 9. The bidirectional clamp 8 can operate for extended periods of time with high voltage and/or high temperature conditions. For example, a DC or common-mode voltage of the sensor signal 10 may have a large voltage difference relative to the high voltage power low supply $V_{HV1}$.

In the illustrated configuration, the switching circuit 3 includes a first p-type double-diffused metal oxide semiconductor (PDMOS) transistor 11, a second PDMOS transistor 12, a capacitor 13, and a gate biasing resistor 14. The first and second PDMOS transistors 11, 12 are electrically connected in series between the resistor 2 and an input of the low voltage amplifier 4. The capacitor 13 includes a first end electrically connected to the sources of the first and second PDMOS transistors 11, 12 and a second end electrically connected to the gates of the first and second PDMOS transistors 11, 12. The capacitor 13 can operate as a low impedance path to high frequency signals, and can be used to prevent damage to the first and second PDMOS transistors during ESD and/or EMI conditions by limiting the PDMOS transistors' gate-to-source voltages in the presence of rapidly changing transient signals. The gate biasing resistor 14 includes a first end electrically connected to the gates of the first and second PDMOS transistors 11, 12 and a second end electrically connected to a control voltage $W_{CTL}$.

As shown in FIG. 1, the gate voltages of the first and second PDMOS transistors 11, 12 are controlled using the control voltage $V_{CTL}$. The control voltage $V_{CTL}$ can be used to turn on or off the switching circuit 3. In one embodiment, the switching circuit 3 is implemented as part of a multiplexer, which is used to select one of two or more input signals as input to the low voltage amplifier 4.

When the switching circuit 3 is turned on, the sensor 1 provides the sensor signal 10 to the input of the low voltage amplifier 4. In the illustrated configuration, the low voltage amplifier 4 is powered using a low voltage power high supply $V_{LV2}$ and a low voltage power low supply $V_{LV1}$. The voltage difference between the low voltage power high supply $V_{LV2}$ and the low voltage power low supply $V_{LV1}$ is less than the voltage difference between the high voltage power high supply $V_{HV2}$ and the high voltage power low supply $V_{HV1}$. The low voltage amplifier 4 can provide precision amplification to the sensor signal 10 to generate an amplified signal that can be further processed by the IC 5.

As shown in FIG. 1, the high voltage input interface and sensor system 20 includes the bidirectional clamp 8, which has been used to limit a voltage difference between the interface port 9 and the high voltage power low supply $V_{HV1}$ in this example. The bidirectional clamp 8 includes a SIG terminal electrically connected to the interface port 9 and a PG terminal electrically connected to the high voltage power low supply $V_{HV1}$. The bidirectional clamp 8 can activate to provide a low impedance path between the interface port 9 and the high voltage power low supply $V_{HV1}$ when a voltage difference between the interface port 9 and the high voltage power low supply $V_{HV1}$ is greater than a forward trigger voltage of the bidirectional clamp 8 or when a voltage difference between the interface port 9 and the high voltage power low supply $V_{HV1}$ is less than a reverse trigger voltage of the bidirectional clamp 8.

Accordingly, the bidirectional clamp 8 can provide protection against ESD events and/or EMI events at the interface port 9 by limiting a maximum and minimum voltage of the interface port 9. The bidirectional clamp 8 can also control a maximum voltage range of the sensor signal 10, by clamping the sensor signal 10 when an amplitude of the sensor signal 10 is greater than the bidirectional clamp's 8 forward trigger voltage or when an amplitude of the sensor signal 10 is less than the bidirectional clamp's reverse trigger voltage.

When normal operating voltages are present at the interface port 9, the bidirectional clamp 8 should draw a relatively low current, for instance, a leakage current of less than 100 nA at 125° C. Additionally, the bidirectional clamp 8 should trigger effectively during an ESD and/or EMI event in order to protect the IC's internal circuitry. The bidirectional clamp 8 can be used to protect a wide variety of IC circuitry, including, for example, the switching circuit 3 and the low voltage amplifier 4. Furthermore, the IC 5 can include parasitic device structures, and the bidirectional clamp 8 can be used to protect such structures. FIG. 1 has been annotated to include a parasitic PNP bipolar transistor 19 to substrate, which illustrates one example of a parasitic device of that can be protected by the bidirectional clamp 8. Absent protection, the parasitic PNP bipolar transistor 19 may get damaged during ESD stress.

The illustrated configuration further includes the resistor 2, which can provide resistance that impedes charge and/or high voltage from reaching sensitive circuitry of the IC 5. For example, the resistor 2 is electrically connected between the interface port 9 and an input of the switching circuit 3, and can be used to limit a flow of current flowing into or out of the switching circuit's input. Thus, the resistor 2 can be included to provide enhanced protection during ESD and/or EMI events and/or to limit the flow of charge during any voltage overshoot that occurs at the interface port 9 while the bidirectional clamp 8 is triggering.

In certain configurations, the bidirectional clamp 8 is configured to have forward and reverse trigger voltages selected such that the bidirectional clamp 8 blocks ±60V DC or more at the interface port 9. For example, ESD protection specifications for high voltage industrial applications, such as instrumentation amplifiers for process control and/or high voltage digital to analog converters (DACs), can operate with such specifications.

The high voltage input interface 20 of FIG. 1 illustrates one example of an interface system that can include one or more of the bidirectional clamps disclosed herein. However, the teachings herein are applicable to other high voltage interfaces, including, for example, output interfaces, input/output interfaces, or other implementations of input interfaces.

Figure 2A:
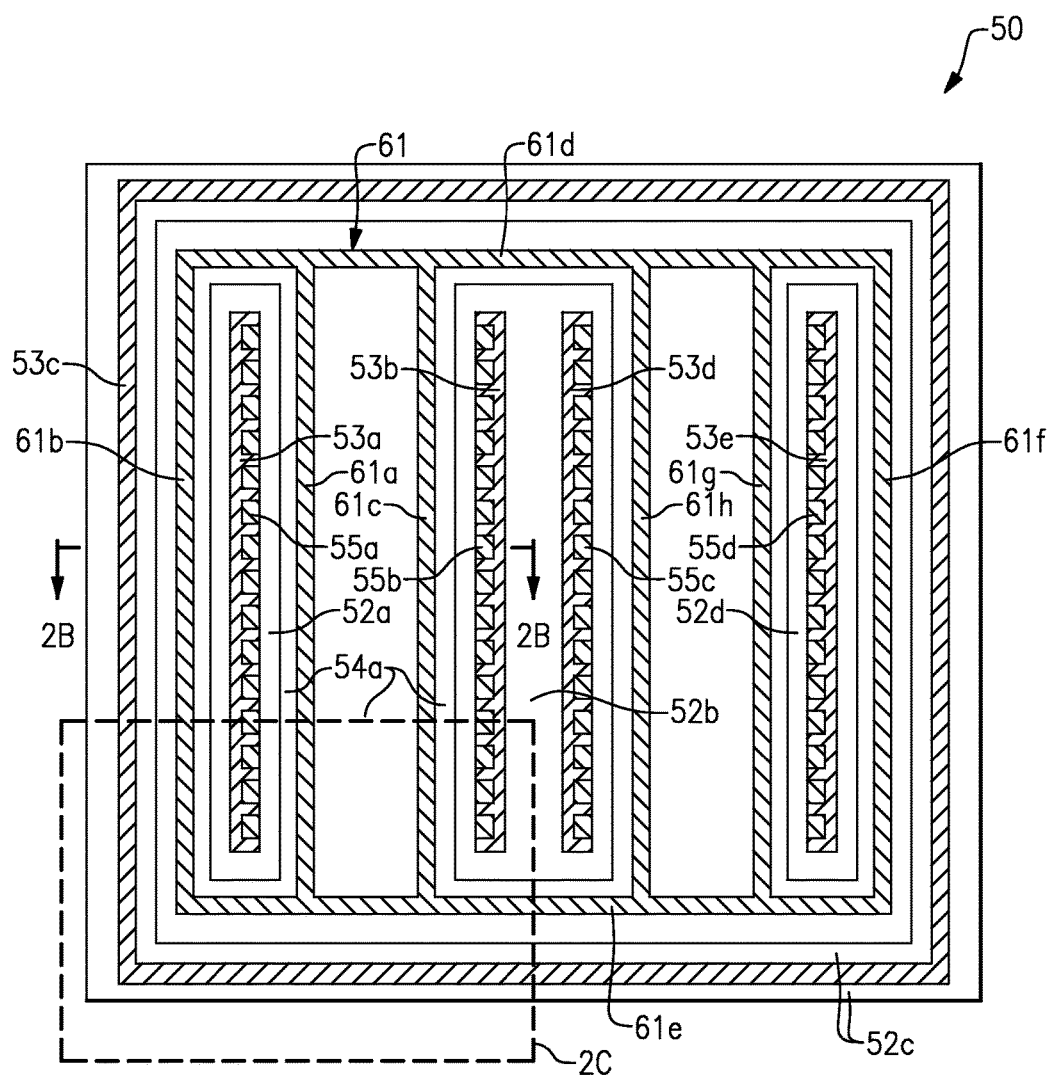
FIG. 2A is a top plan view of a low leakage bidirectional clamp according to one embodiment.
Figure 2B:
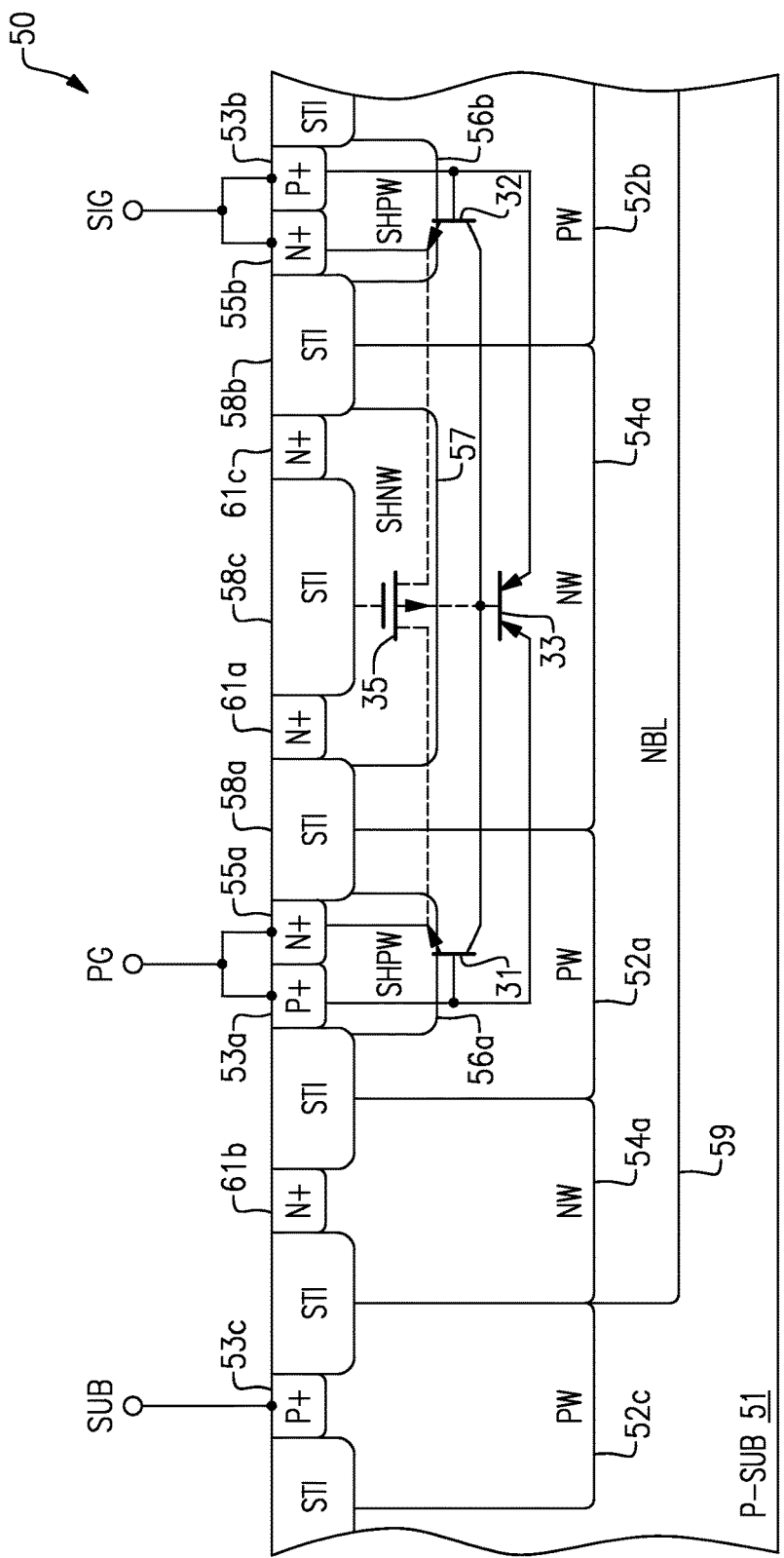
FIG. 2B is an annotated cross-section of the low leakage bidirectional clamp of FIG. 2A taken along the lines 2B-2B of FIG. 2A.
Figure 2C:
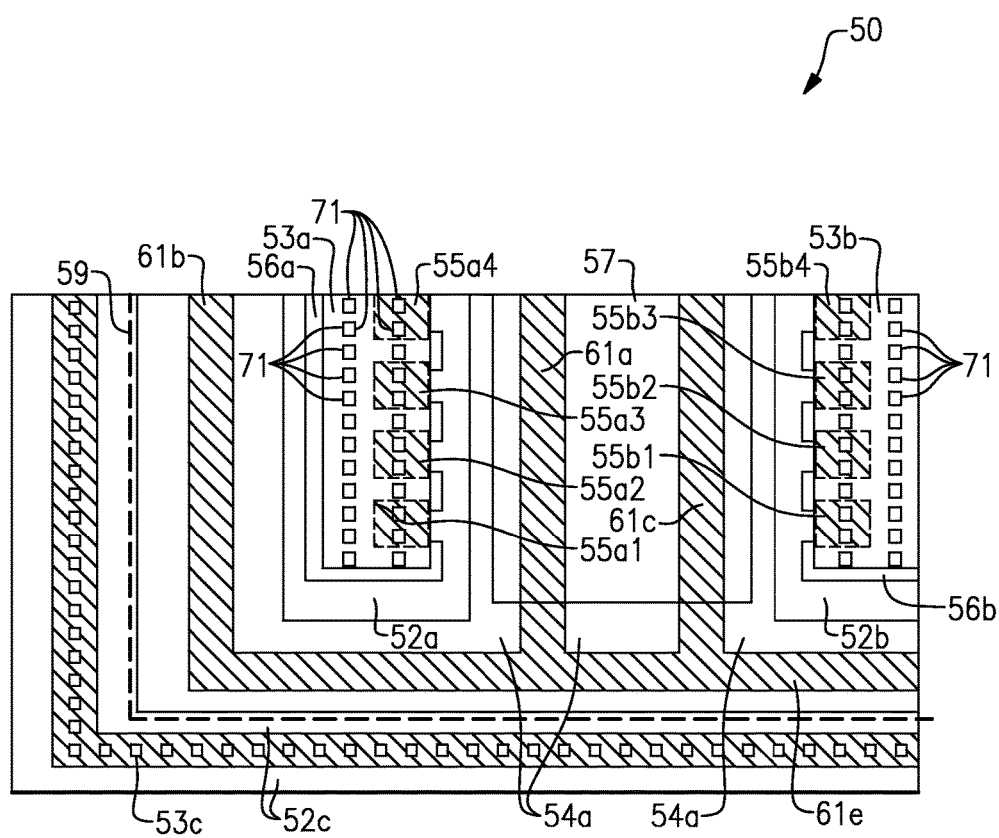
FIG. 2C is an expanded plan view of the low leakage bidirectional clamp of FIG. 2A in the region 2C of FIG. 2A.

FIG. 2A is a top plan view of a low leakage bidirectional clamp 50 according to one embodiment. FIG. 2B is an annotated cross-section of the bidirectional clamp 50 of FIG. 2A taken along the lines 2B-2B of FIG. 2A. FIG. 2C is an expanded plan view of the bidirectional clamp 50 of FIG. 2A in the region 2C of FIG. 2A.

The illustrated bidirectional clamp 50 of FIGS. 2A-2C is fabricated in a p-type substrate (P-SUB) 51, and includes an n-well 54a, a first p-well 52a, a second p-well 52b, a third p-well 52c, a fourth p-well 52d, a first p-type active (P+) region 53a, a second P+ region 53b, a third P+ region 53c, a first array of n-type active (N+) regions including a first N+ region 55a, a second array of N+ regions including a second N+ region 55b, a third array of N+ regions including a third N+ region 55c, a fourth array of N+ regions including a fourth N+ region 55d, an anti-inversion N+ ring structure 61, a shallow n-type well (SHNW) 57, a first shallow p-type well (SHPW) 56a, a second SHPW 56b, an n-type buried layer (NBL) 59, and oxide regions including a first oxide region 58a, a second oxide region 58b, and a third oxide region 58c.

For purposes of clarity, only the n-well 54a, the p-wells 52a-52c, the P+ regions 53a-53e, the arrays of N+ regions, and the anti-inversion N+ ring structure 61 are shown in the top plan view of FIG. 2A.

As shown in FIG. 2A, the second p-well 52b is implemented as a first island in the n-well 54a. Additionally, the first p-well 52a is implemented as a second island in the n-well 54a, and is positioned on a first or left side of the second p-well 52b. A first region of the n-well 54a is positioned between the first p-well 52a and the second p-well 52b, and operates as a current path when the bidirectional clamp 50 is activated. The fourth p-well 52d is implemented as a third island in the n-well 54a, and is positioned on a second or right side of the second p-well 52b opposite the left side. A second region of the n-well 54b is positioned between the fourth p-well 52d and the second p-well 52b, and also operates as a current path when the bidirectional clamp 50 is activated.

The first P+ region 53a is positioned in the first p-well 52a, and is implemented to have a comb shape in this embodiment. Additionally, the first array of N+ regions is positioned in the first p-well 52a adjacent to the first P+ region 53a, such that portions of the first P+ region 53a extend between adjacent pairs of N+ regions in the array. The second P+ region 53b is positioned in the second p-well 52b, and is implemented to have a comb shape in this embodiment. Additionally, the second array of N+ regions is positioned in the second p-well 52b, such that portions of the second P+ region 53b extend between adjacent pairs of N+ regions in the array. The first and second P+ regions 53a, 53b are orientated such that the extending portions of the first P+ region 53a face the extending portions of the second P+ region 53b. Additional details of the first and second P+ regions 53a, 53b and the first and second arrays of N+ regions will be described further below with reference to FIG. 2C.

The fourth P+ region 53d is positioned in the second p-well 52b, and is implemented in a comb shape. Additionally, the third array of N+ regions is positioned in the second p-well 52b adjacent to the fourth P+ region 53d, such that portions of the fourth P+ region 53d extend between adjacent pairs of N+ regions in the array. The fifth P+ region 53e is positioned in the fourth p-well 52d, and is implemented in a comb shape. Additionally, the fourth array of N+ regions is positioned in the fourth p-well 52d adjacent to the fifth P+ region 53e, such that portions of the fifth P+ region 53e extend between adjacent pairs of N+ regions in the array.

The third p-well 52c is implemented as a ring that surrounds and abuts the n-well 54a. Additionally, the third P+ region 53c is positioned in the third p-well 52c, and operates with the third p-well 52c as a guard ring of the bidirectional clamp 50. The guard ring can inhibit or eliminate formation of unintended parasitic paths between the bidirectional clamp 50 and surrounding semiconductor components when integrated on-chip. Although FIGS. 2A-2C illustrate the third p-well 52c as abutting the n-well 54a, in other configurations the third p-well 52c is spaced apart from the n-well 54a to enhance latch-up immunity at an expense of an increase in area. As will be described further below, the guard ring is electrically connected to the bidirectional clamp's SUB terminal, which can be electrically connected, for example, to a power low or ground supply.

In the illustrated embodiment, the first SHPW 56a is positioned in the first p-well 52a beneath the first P+ region 53a and the first array of N+ regions. Additionally, the second SHPW 56b is positioned in the second p-well 52b beneath the second P+ region 53b and the second array of N+ regions. Although not illustrated in the figures, a third SHPW can be included in the second p-well 52b beneath the fourth P+ region 53d and the third array of N+ regions, and a fourth SHPW can be included in the fourth p-well 52d beneath the fifth P+ region 53e and the fourth array of N+ regions.

In the illustrated configuration, a first SHNW 57 is included in the first region of the n-well 54a between the first and second p-wells 52a, 52b. Although not illustrated in the figures, a second SHNW can be included in the second region of the n-well 54a between the second and fourth p-wells 52b, 52d.

The NBL layer 59 is positioned beneath the n-well 54a, the first p-well 52a, the second p-well 52b, and the fourth p-well 52d. The NBL layer 59 serves to electrically isolate the first p-well 52a, the second p-well 52b, and the fourth p-well 54b from the P-SUB 51, thereby permitting the P-SUB 51 and the first, second, and/or fourth p-wells 52a-52b, 52d to operate at different electrical potentials. As used herein, and as will be understood by one of skill in the art, the term "n-type buried layer" refers to any suitable n-type isolation layer or structure, including, for example, those used in buried n-layer technologies or in deep n-well technologies. In the illustrated configuration, the n-well 54a and the NBL layer 59 are configured to be electrically floating, which can aid in expanding a range of bidirectional blocking voltages over which the bidirectional clamp's terminals can operate.

In certain configurations, the P-SUB 51 includes a p-type epitaxial (P-EPI) layer, which can provide high voltage breakdown to substrate at low cost. For example, the P-SUB 51 can include a P-EPI layer over a doped or un-doped carrier substrate, and the bidirectional clamp 50 can be fabricated in the P-EPI layer. In one embodiment, the P-SUB 51 includes a carrier substrate implanted with the NBL layer 59, and a P-EPI layer grown over the carrier substrate and NBL layer 59 using an epitaxial growth process. Additionally, the n-well 54a, the p-wells 52a-52d, the SHPWs 56a, 56b, and the SHNW 57 can be implanted in the P-EPI layer. Furthermore, the oxide regions can be formed over the surface of the P-EPI layer, and N+ regions and P+ regions can be implanted in the corresponding well regions. Although one implantation of a bidirectional clamp fabricated in a P-EPI layer has been described, other implementations are possible.

In other configurations, the bidirectional clamp 50 is fabricated using a silicon-on-insulator (SOI) process, and the NBL layer 59 is omitted in favor of isolating the p-wells from a support substrate using an insulator layer.

Although not illustrated in FIGS. 2A-2C, the P-SUB 51 can also include other devices or structures formed therein.

As shown in FIG. 2B, the n-well 54a and the p-wells 52a-52d have a depth into the P-SUB 51 that is greater than a depth into the P-SUB 51 of the SHNW 57 and the first and second SHPWs 56a, 56b. Additionally, the SHNW 57 and first and second SHPWs 56a, 56b have a depth into the P-SUB 51 that is greater than a depth of the N+ and P+ regions. Furthermore, the oxide regions have a depth that is greater than a depth of the N+ and P+ regions.

In one embodiment, the n-wells and p-wells have a depth into the P-SUB 51 in the range of about 3.0 μm and about 4.5 μm, for example, about 3.5 μm. Additionally, the SHPWs and the SHNWs have a depth into the P-SUB in the range of about 0.5 μm and about 1.5 μm, for example, about 1.0 μm. Furthermore, the N+ and P+ regions have a depth into the P-SUB 51 in the range of about 0.15 μm and about 0.5 μm, for example, about 0.2 μm. Additionally, the oxide regions have a depth into the P-SUB 51 that is greater than the depth of the N+ and P+ regions but less than a depth of the SHNWs and SHPWs. For example, in certain configurations, the oxide regions have a depth into the P-SUB 51 in the range of about 0.35 μm to about 0.5 μm, for example, about 0.38 μm. Although various examples of depths have been described above, persons having ordinary skill in the art will readily ascertain other suitable depth values.

In the illustrated embodiment, the N+ regions have a higher doping concentration than the SHNW 57, which in turn has a higher doping concentration than the n-well 54a. Additionally, the P+ regions have a higher doping concentration than the SHPWs 56a, 56b, which in turn have a higher peak doping concentration than the p-wells 52a-52d.

In one embodiment, the P-SUB 51 has a doping concentration in the range of about $0.5 \times 10^{15}$ cm$^{-3}$ to about $1.5 \times 10^{15}$ cm$^{-3}$, for example, about $1.0 \times 10^{15}$ cm$^{-3}$. In certain configurations, the P-SUB 51 includes a P-EPI layer having a peak doping concentration in the range of about $1 \times 10^{14}$ cm$^{-3}$ to about $8.0 \times 10^{14}$ cm$^{-3}$, for example, about $2.0 \times 10^{14}$ cm$^{-3}$. Additionally, the NBL layer 59 has a peak doping concentration in the range of about $0.5 \times 10^{17}$ cm$^{-3}$ to about $0.5 \times 10^{18}$ cm$^{-3}$, for example, about $2.5 \times 10^{17}$ cm$^{-3}$. Furthermore, the P+ regions and the N+ regions have a peak doping concentration in the range of about $1 \times 10^{20}$ cm$^{-3}$ to about $8 \times 10^{20}$ cm$^{-3}$, for example, about $5 \times 10^{20}$ cm$^{-3}$, the SHPWs and the SHNWs have a peak doping concentration in the range of about $2.5 \times 10^{17}$ cm$^{-3}$ to about $9.5 \times 10^{17}$ cm$^{-3}$, for example, about $7.0 \times 10^{17}$ cm$^{-3}$, and the p-wells and n-wells have a peak doping concentration in the range of about $1.5 \times 10^{16}$ cm$^{-3}$ to about $7.5 \times 10^{16}$ cm$^{-3}$, for example, about $3.0 \times 10^{16}$ cm$^{-3}$. Although various ranges of peak doping concentrations and depth have been described above, persons having ordinary skill in the art will readily ascertain other suitable doping concentrations In the illustrated configuration, the first p-well 52a, the second p-well 52b, and the fourth p-well 54d extend or are elongated in a first or vertical direction. Additionally, a current flow of the bidirectional clamp when activated is in a second or horizontal direction.

The anti-inversion N+ ring structure 61 includes a first N+ dummy leakage current blocking region 61a in the n-well 54a that extends in the vertical direction along a first or right side of the first p-well 52a. The first N+ dummy leakage current blocking region 61a is in the first region of the n-well 54a that is between the first and second p-wells 52a, 52b, and extends beyond a top side of the first p-well 52a and beyond a bottom side of the first p-well 52a. The anti-inversion N+ ring structure 61 further includes a second N+ dummy leakage current blocking region 61b in the n-well 54a on a second or left side of the first p-well 52a opposite the first N+ dummy leakage current blocking region 61a. The second dummy leakage current blocking region 61b is substantially parallel to the first dummy leakage current blocking region 61a. The anti-inversion N+ ring structure 61 further includes a third N+ dummy leakage current blocking region 61c that extends in the vertical direction along the left side of the second p-well 52b. The third N+ dummy leakage current blocking region 61c is between the first and second p-wells 52a, 52b and is adjacent to the first dummy leakage current blocking region 61a.

The anti-inversion N+ ring structure 61 further includes a fourth N+ dummy leakage current blocking region 61d in the n-well 54a that extends in the horizontal direction along the top sides of the p-wells 52a-52b, 52d. The anti-inversion N+ ring structure 61 further includes a fifth N+ dummy leakage current blocking region 61e that extends in the horizontal direction along the bottom sides of the p-wells 52a-52b, 52d. The anti-inversion N+ ring structure 61 further includes a sixth N+ dummy leakage current blocking region 61f that extends in the vertical direction along a right side of the fourth p-well 54d. The anti-inversion N+ ring structure 61 further includes seventh and eight N+ dummy leakage current blocking regions 61g, 61h, which extend vertically and are positioned adjacent to one another between the second and fourth p-wells 52b, 52d.

As shown in FIG. 2A, the N+ dummy leakage current blocking regions 61a-61h of the anti-inversion N+ ring structure 61 form various rings in the n-well 54a. For example, the N+ dummy leakage current blocking regions 61a, 61c, 61d, and 61e operate as sides of a first N+ ring that is between the first and second p-wells 52a, 52b. Additionally, the N+ dummy leakage current blocking regions 61a, 61b, 61d, and 61e operate as sides of a second N+ ring that surrounds a perimeter of the first p-well 52a. Furthermore, the N+ dummy leakage current blocking regions 61c, 61d, 61e, and 61h operate as a third N+ ring that surrounds a perimeter of the second p-well 52b. Additionally, the dummy leakage current blocking regions 61g, 61h, 61d, and 61e operate as sides of a fourth N+ ring that is between the second and fourth p-wells 52b, 52d. Furthermore, the N+ dummy leakage current blocking regions 61f, 61g, 61d, and 61e operate as sides of a fifth N+ ring that surrounds a perimeter of fourth p-well 52d.

The illustrated blocking voltage device 50 includes the oxide regions, such as the first oxide region 58a, the second oxide region 58b, and the third oxide region 58c. Formation of the oxide regions can involve etching trenches in the P-SUB 51, filling the trenches with a dielectric, such as silicon dioxide ($SiO_2$), and removing the excess dielectric using any suitable method, such as chemical-mechanical planarization. In certain implementations, the oxide regions are shallow trench (STI) regions disposed between active regions. In the illustrated configuration, the first oxide region 58a extends over a boundary between the first p-well 52a and the n-well 54a, and the second oxide region 58b extends over a boundary between the second p-well 52b and the n-well 54a. Additionally, the third oxide region 58c is positioned over the first region of the n-well 54a between the first and second p-wells 52a, 52b. As shown in FIG. 2B, the first N+ dummy leakage current blocking region 61a is positioned between the first and third oxide regions 58a, 58c, and the third N+ dummy leakage current blocking region 61c is positioned between the second and third oxide regions 58b, 58c.

As will be described in detail further below, the anti-inversion N+ ring structure 61 decreases the leakage current of the bidirectional clamp 50. In particular, the N+ ring structure 61 prevents formation of a continuous inversion layer along the boundaries between oxide regions and the n-well 54a. Thus, even when charge is trapped at the boundaries between the oxide regions and the n-well 54a and inversion layers are formed, a charge trapping-induced leakage path is prevented, since the inversion layers do not provide a continuous electrical path between the first and second p-wells 52a, 52b or between the second and fourth p-wells 52b, 52d. Thus, the bidirectional clamp 50 operates with robust off-state performance and low leakage current, even when operating over extended periods of time at high temperature and/or with high voltages between the clamp's terminals.

With reference to FIG. 2B, electrical connections to terminals have been annotated in the illustrated cross-section. For example, the bidirectional clamp 50 includes a first or PG terminal, which is electrically connected to the first N+ region 55a and to the first P+ region 53a. Additionally, the bidirectional clamp 50 includes a second or SIG terminal, which is electrically connected to the second N+ region 55b and to the second P+ region 53b. Furthermore, the bidirectional clamp 50 includes a third or SUB terminal, which is electrically connected to the third P+ region 53c. The illustrated electrical connections can be made using contacts and metallization during back end processing.

The bidirectional clamp 50 of FIG. 2B has been further annotate to show certain circuit devices present in the cross-section, including a first NPN bipolar transistor 31, a second NPN bipolar transistor 32, a PNP bidirectional bipolar transistor 33, and a parasitic surface PMOS transistor 35.

The first NPN bipolar transistor 31 includes an emitter electrically connected to the first N+ region 55a, a base electrically connected to the first P+ region 53a and to an emitter/collector of the PNP bidirectional bipolar transistor 33, and a collector electrically connected to a base of the PNP bidirectional bipolar transistor 33. The second NPN bipolar transistor 32 includes an emitter electrically connected to the second N+ region 55b, a base electrically connected to the second P+ region 53b and to a collector/emitter of the PNP bidirectional bipolar transistor 33, and a collector electrically connected to the base of the PNP bidirectional bipolar transistor 33.

The bidirectional PNP bipolar transistor 33 operates bidirectionally, and the operation of the emitter/collector and the collector/emitter as emitter and collector can depend on the voltage conditions of the PG and SIG terminals. For example, when a voltage of the SIG terminal is greater than a voltage of the PG terminal, the emitter/collector of the bidirectional PNP bipolar transistor 33 serves as an emitter and the collector/emitter of the bidirectional PNP bipolar transistor 33 serves as a collector. In contrast, when the voltage of the SIG terminal is less than the voltage of the PG terminal, the emitter/collector of the bidirectional PNP bipolar transistor 33 serves as a collector and the collector/emitter of the bidirectional PNP bipolar transistor 33 serves as an emitter.

During normal operating conditions between the PG terminal and the SIG terminal, the bidirectional clamp 50 should be turned off and not conduct.

However, when the voltage of the SIG terminal is greater than the voltage of PG terminal by a forward trigger voltage of the bidirectional clamp 50, a first silicon controlled rectifier (SCR) that includes the PNP bidirectional bipolar transistor 33 and the first NPN bipolar transistor 31 can trigger to provide a low impedance path between the SIG and PG terminals. In particular, the PNP bidirectional bipolar transistor 33 and the first NPN bipolar transistor 31 are cross-coupled. Thus, when the voltage difference between the SIG terminal and the PG terminal reaches a trigger voltage of the first SCR (corresponding to a forward trigger voltage of the bidirectional clamp 50), feedback between the PNP bidirectional bipolar transistor 33 and the first NPN bipolar transistor 31 can be regenerative and cause the first SCR to enter or transition into a low-impedance state.

Additionally, when the voltage of the SIG terminal is less than the voltage of PG terminal by a reverse trigger voltage of the bidirectional clamp 50, a second SCR that includes the PNP bidirectional bipolar transistor 33 and the second NPN bipolar transistor 32 can trigger to provide a low impedance path between the PG and SIG terminals. In particular, the PNP bidirectional bipolar transistor 33 and the second NPN bipolar transistor 32 are cross-coupled. Thus, when the voltage difference between the PG terminal and the SIG terminal reaches a trigger voltage of the second SCR (corresponding to a revere trigger voltage of the bidirectional clamp 50), feedback between the PNP bidirectional bipolar transistor 33 and the second NPN bipolar transistor 32 can be regenerative and cause the second SCR to enter or transition into a low-impedance state.

The bidirectional clamp 50 has been further annotated to show a parasitic surface PMOS transistor 35. The parasitic surface PMOS transistor 35 includes a gate associated with the third oxide region 58c, a body associated with n-well 54a, a source associated with the first p-well 52a, and a drain associated with the second p-well 52b.

The bidirectional clamp 50 can operate in harsh operating conditions, which can result in charge being trapped along interfaces between oxide regions and the n-well 54a. For instance, when operating the bidirectional clamp 50 with high voltage and/or high temperature, charge can accumulate at an oxide-semiconductor interface, which can lead to a shift in the threshold voltage of the parasitic surface PMOS transistor 35.

The illustrated bidirectional clamp 50 includes the first and third N+ leakage current blocking regions 61a, 61c which to operate interrupt an electrical path from the first p-type well 52a and the second p-well 52b along an oxide-semiconductor interface between the n-well 54a and the oxide regions 58a, 58b, 58c. Thus, even when charge accumulates at the interface between the first oxide region 58a and the n-well 54a, at the interface between the second oxide region 58b and the n-well 54b, and/or the third oxide region 58c and the n-well 54c, the N+ dummy leakage current blocking regions inhibit charge trapping-induced leakage. For example, even when inversion layers are present beneath the interface between the first oxide region 58a and the n-well 54a, beneath the interface between the second oxide region 58b and the n-well 54a, and beneath the interface between the third oxide region 58c and the n-well 54c, the inversion layers do not provide a continuous or unbroken electrical path between the first and second p-wells 52a, 52b.

In contrast, when the N+ dummy current block regions 61a, 61c are omitted, an oxide region can extend over the n-well 54a between the first p-well 52a and the second p-well 52b. Additionally, a shift in standing leakage can occur in a bidirectional clamp over time when operating in relatively high voltage and/or high temperature conditions, e.g., >±60 V and >125° C., respectively, due to charges accumulating at an oxide-semiconductor interface between the oxide region and the n-well 54a. The accumulated charge can generate an inversion layer beneath the oxide-semiconductor interface, which provides a leakage path even when the bidirectional clamp should be turned off, triggering reliability problems in circuit applications specified to operate under such conditions, typical in industrial and automotive environments.

Thus, the illustrated configurations inhibits an inversion layer generated by the parasitic surface PMOS transistor 35, which can otherwise generate a leakage current path between the clamp's terminals when operated for extended periods of time in harsh operating conditions.

The anti-inversion N+ ring structure 61 inhibits the parasitic surface PMOS transistor 35 from conducting, and provides leakage current blocking to an electrical path between the first p-well 52a and the second p-well 52b along interfaces between oxide regions and the n-well 54a. The anti-inversion N+ ring structure 60 operates as a recombination center and prevents channel-like formation in the parasitic surface PMOS transistor 35 when the charges are trapped at the oxide-semiconductor interface. Thus, the bidirectional clamp 50 can exhibit low static power dissipation, while providing a relatively small impact on the on-state performance of the clamp.

The illustrated configuration includes both the first N+ dummy leakage current blocking region 61a and the third dummy leakage current blocking region 61c, which operate with to fourth and fifth N+ dummy leakage current blocking regions 61d, 61e to form an N+ ring in the first region of the n-well 54a between the first and second p-wells 52a, 52b. The N+ ring extends beyond both the top and bottom sides of the first and second p-wells 52a, 52b to inhibit leakage. Including two more N+ dummy leakage current blocking regions in an electrical path between the first and second p-wells 52a, 52b can provide enhanced carrier recombination and/or further disrupt an inversion layer generated by the parasitic surface PMOS transistor 35 via charge trapping. However, other configurations are possible, such as implementations in which more or fewer N+ dummy leakage current blocking regions are included in the electrical path between the first and second p-wells 52a, 52b.

The anti-inversion N+ ring structure 61 of FIGS. 2A-2C also include three N+ rings that separately surround the first p-well 52a, the second p-well 52b, and the fourth p-well 52d. Including an N+ ring around a p-well can further enhance off-state performance by inhibiting charge trapping-induced leakage.

The illustrated bidirectional clamp 50 further includes the SHNW 71 beneath the first and third N+ dummy leakage current blocking regions 61a, 61c. Including the SHNW 71 can further inhibit the parasitic surface PMOS transistor 35 from generating an inversion layer by increasing an n-type doping concentration near the oxide-semiconductor interface between the third oxide region 58c and the n-well 54b.

With reference to FIG. 2C, one implementation of contacts 71 have been shown. The contacts 71 show electrical connections between the PG terminal and the first P+ region 53a and the first array of N+ regions 55a1-55a4. Additionally, the contacts 71 show electrical connections between the SIG terminal and second P+ region 53b and the second array of N+ regions 55b1-55b4. Furthermore, the contacts 71 show electrical connections between the SUB terminal and the third P+ region 53c.

In the illustrated configuration, the contacts 71 are not used to contact the anti-inversion N+ ring structure 61. Rather, the anti-inversion N+ ring structure 61 is electrically floating. Configuring the anti-inversion N+ ring structure 61 can increase a voltage operating range of the bidirectional clamp 50, which can aid in meeting high blocking voltage specifications, such as those associated with high voltage precision interfaces.

As shown in FIG. 2C, the first P+ region 53a is implemented in a comb shape, and includes elongated regions that extend between adjacent N+ regions of the first array of N+ regions. Configuring the protection device 50 in this manner can be used to increase the forward holding and trigger voltage of the bidirectional clamp 50. For example, the illustrated configuration reduces the gain and conduction strength of the first NPN bipolar transistor 31 of FIG. 2B relative to the gain and conduction strength of the PNP bidirectional bipolar transistor 33 of FIG. 2B. Additionally, the second P+ region 53b is implemented in a comb shape, and includes elongated regions that extend between adjacent N+ regions of the second array of N+ regions. Configuring the protection device 50 in this manner can be used to increase the reverse holding and trigger voltage of the bidirectional clamp 50 by reducing the gain and conduction strength of the second NPN bipolar transistor 32 of FIG. 2B relative to the gain and conduction strength of the PNP bidirectional bipolar transistor 33 of FIG. 2B. Although one example of diffusion regions in the first and second p-wells 52a, 52b has been shown, other configurations are possible. For example, in another embodiment, the first p-well 52a includes a first P+ region and a first N+ region that extend in the vertical direction alongside one another, and the second p-well 52b includes a second P+ region and a second N+ region that extend in the vertical direction alongside one another.

The illustrated configuration further includes the first SHPW 56a and the second SHPW 56b, which can in fine-tuning the on-state transient performance of the bidirectional clamp 50. For example, the first and second SHPWs 56a, 56b can increase a surface concentration of p-type carriers in the first and second p-wells 54a, 52b, which can be used to adjust the bidirectional blocking voltage characteristics of the bidirectional clamp to lower voltage. However, other configurations are possible to achieve a desired on-state protection characteristic of the bidirectional clamp 50.

The bidirectional clamp 50 of FIGS. 2A-2C corresponds to one embodiment of the bidirectional clamp 8 shown in FIG. 1. For example, the SIG terminal can be electrically connected to interface port 9 of FIG. 1, and the PG terminal can be electrically connected to the high voltage power low supply $V_{HV1}$. However, the bidirectional clamp 50 can be used in other configurations of high voltage interfaces.

In FIGS. 2A-2C, the bidirectional clamp 50 is symmetrical about a center of the n-well 54a. For example, although FIG. 2B illustrates a cross-section of a left-hand-side of the bidirectional clamp 50, a cross-section of the right-hand-side of the bidirectional clamp 50 can be similar. However, persons having ordinary skill in the art will appreciate that the teachings herein are also applicable to asymmetric devices. For example, asymmetrical structures can be provided by arranging the wells, active regions, and/or other structures of the device in an asymmetric configuration.

The illustrated bidirectional clamp 50 includes two sections of SCR devices. For example, the bidirectional clamp 50 includes a first section of SCR devices associated with the first P+ region 53a, the first array of N+ regions, the first p-well 54a, a first region of the first n-well 54a between the first and second p-wells 54a, 54b, the second p-well 54b, the second array of N+ regions, and the second P+ region 53b. Additionally, the bidirectional clamp 50 includes a second section of SCR devices associated with the fifth P+ region 53e, the fourth array of N+ regions, the fourth p-well 54d, a second region of the first n-well 54a between the third and fourth p-wells 54c, 54d, the second p-well 54b, the third array of N+ regions, and the fourth P+ region 53d. The two sections of SCR devices are electrically connected to one another via metallization to operate as the bidirectional clamp 50.

Although the illustrated configuration includes two sections of SCR devices, the teachings herein are applicable to configurations in which a bidirectional clamp includes more of fewer sections of SCR devices. For example, additional sections of SCR devices can be added and electrically connected using metallization to provide higher current handling capability. Additionally, the teachings herein are applicable to configurations with one section of SCR devices. Furthermore, although FIG. 2A illustrates a planar configuration, the teachings herein are also applicable to annular configurations.

Figure 3A:
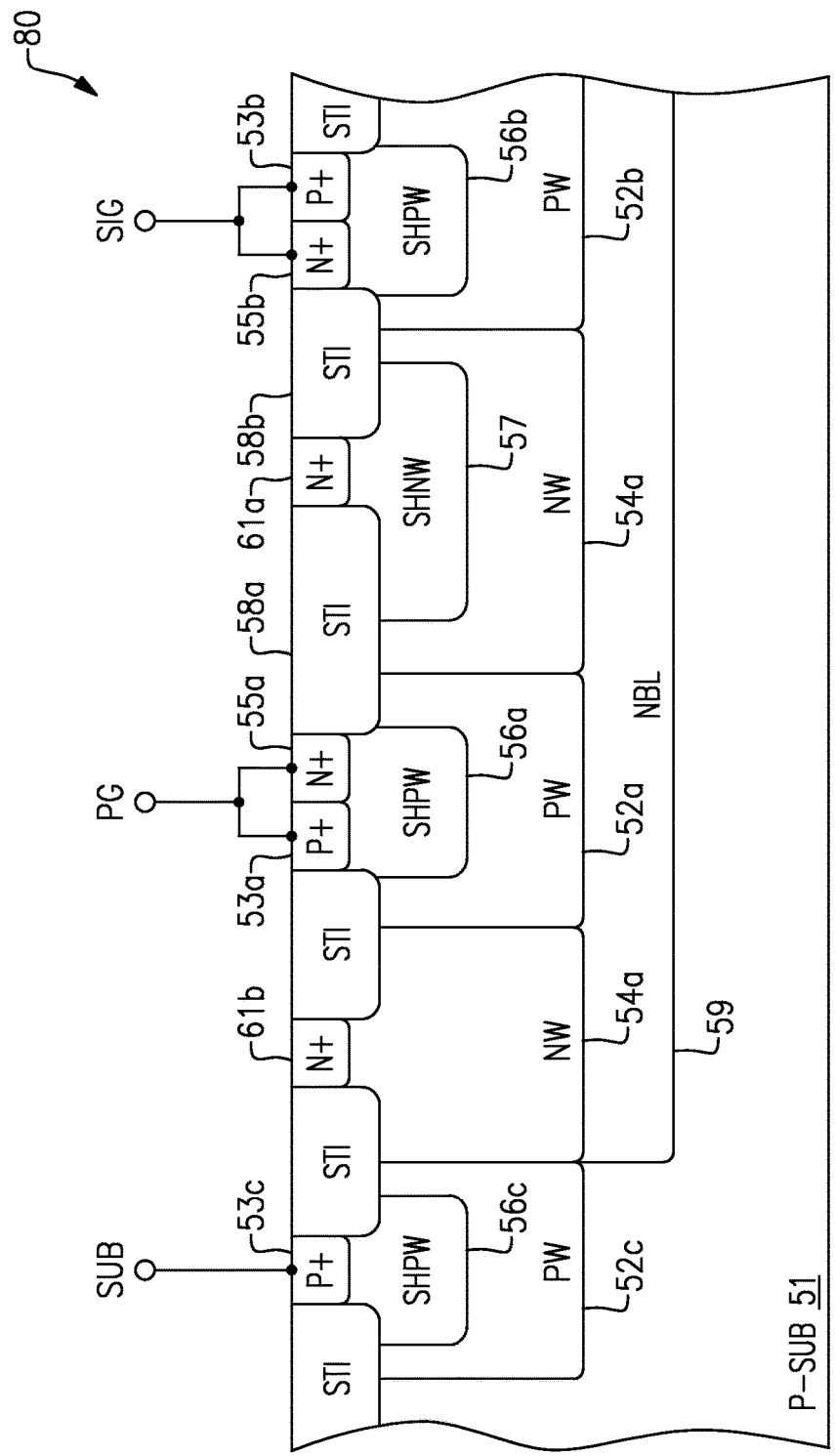
FIG. 3A is a cross-section of a low leakage bidirectional clamp according to another embodiment.
Figure 3B:
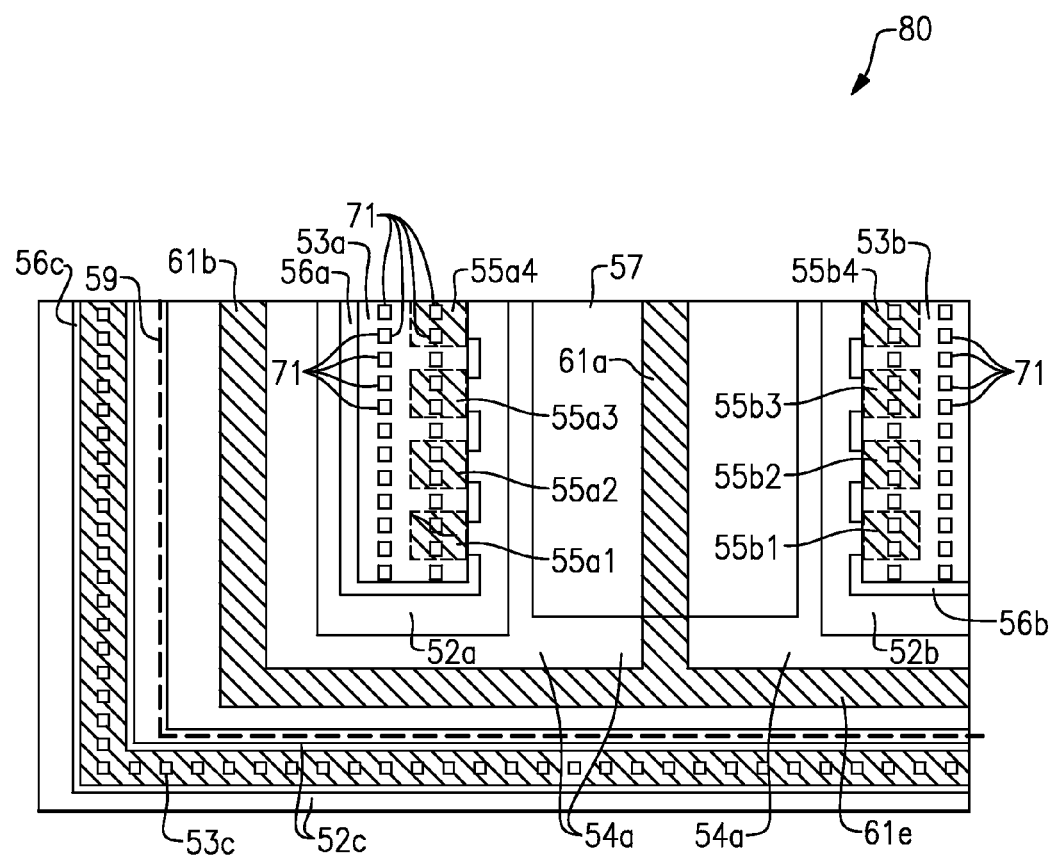
FIG. 3B is a plan view of a portion of the low leakage bidirectional clamp of FIG. 3A.

FIG. 3A is a cross-section of a low leakage bidirectional clamp 80 according to another embodiment. FIG. 3B is a plan view of a portion of the bidirectional clamp 80 of FIG. 3A. The bidirectional clamp 80 of FIGS. 3A-3B is similar to the bidirectional clamp 50 of FIGS. 2A-2C, except that the bidirectional clamp 80 further includes a third SHPW 56c, which can enhance operation of the guard ring structure of bidirectional clamp. Additionally, in comparison to the bidirectional clamp 50 of FIGS. 2A-2C, the bidirectional clamp 80 omits the third N+ leakage current blocking region 61c.

As shown in FIG. 3A, the first oxide region 58a extends over a boundary between the first p-well 52a and the n-well 54a, and the second oxide region 58b extends over a boundary between the second p-well 52b and the n-well 54a. Additionally, the first N+ leakage current blocking region 61a is positioned between the first oxide region 58a and the second oxide region 58b to block charge trapping-induced leakage current. Thus, even when an inversion layer forms between the interface between the n-well 54a and the first oxide region 58a and between the interface between the n-well 54a and the second oxide region 58b, the first N+ current block region 61a blocks leakage current by preventing a continuous electrical path from the first p-well 52a to the second p-well 52b through the inversion layers. Additional details of the bidirectional clamp 80 can be similar to those described earlier.

Figure 4A:
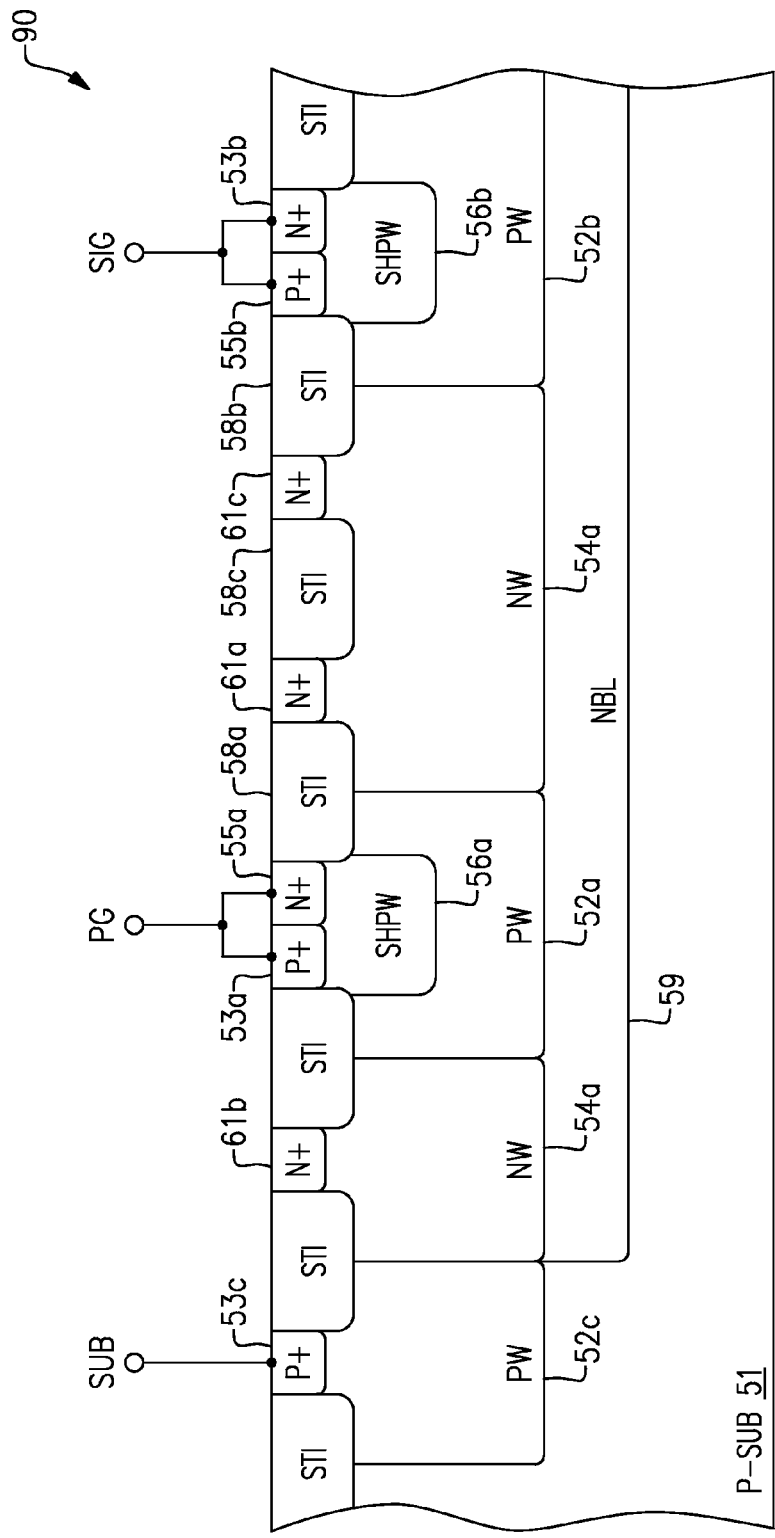
FIG. 4A is a cross-section of a low leakage bidirectional clamp according to another embodiment.

FIG. 4A is a cross-section of a low leakage bidirectional clamp 90 according to another embodiment. The bidirectional clamp 90 of FIG. 4A is similar to the bidirectional clamp 50 of FIGS. 2A-2C, except that the bidirectional clamp 90 omits the SHNW 57. Although omitting the SHNW 57 may enhance off-state performance by inhibiting formation of inversion layers beneath oxide-semiconductor interfaces, the SHNW 57 may not be necessary in certain applications and/or may be unavailable in certain fabrication processes. Additional details of the bidirectional clamp 90 can be similar to those described earlier.

Figure 4B:
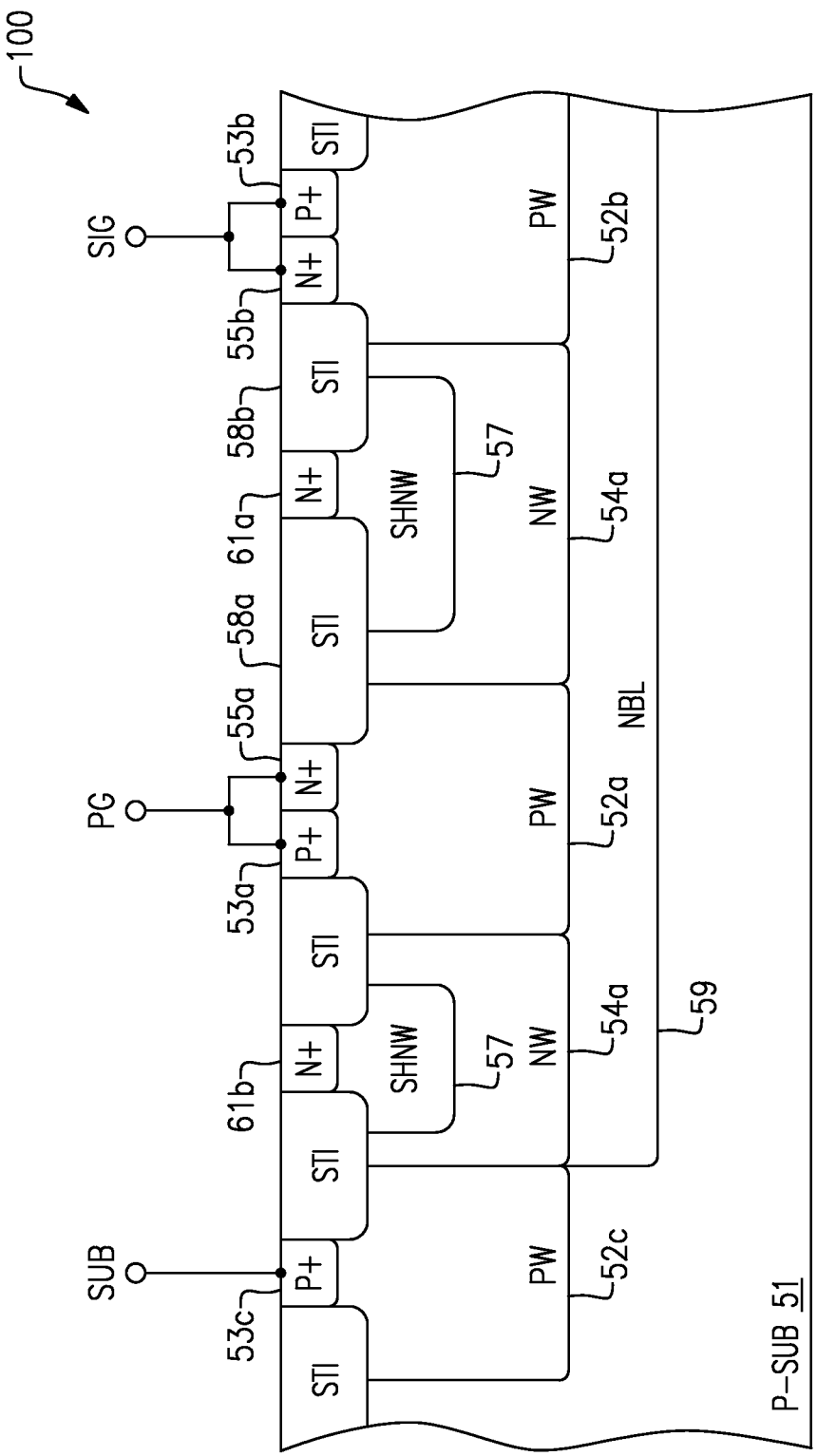
FIG. 4B is a cross-section of a low leakage bidirectional clamp according to another embodiment.

FIG. 4B is a cross-section of a low leakage bidirectional clamp 100 according to another embodiment. The bidirectional clamp 100 of FIG. 4B is similar to the bidirectional clamp 50 of FIGS. 2A-2C, except that the bidirectional clamp 100 omits the third N+ leakage current blocking region 61c and the first and second SHPWs 56a, 56b. Additionally, the bidirectional clamp 100 of FIG. 4B further includes the SHNW 57 beneath the second N+ leakage current blocking region 61b. Including the SHNW 57 beneath the second N+ leakage current blocking region 61b may enhance off-state performance by inhibiting formation of inversion layers, but may also increase layout area in certain manufacturing processes. Additional details of the bidirectional clamp 100 can be similar to those described earlier.

In the embodiments described above, the protections devices can include layers, regions, and/or wells having n-type or p-type dopants. In other embodiments, the doping types of all the layers, regions, and wells of the blocking voltage devices can be opposite to those described and shown in the above embodiments, and the same principles and advantages can still apply to the other embodiments. For example, a complementary version of the bidirectional clamps of FIGS. 2A-4B can be formed using an n-type substrate. In such embodiments, an n-type isolation layer is replaced with a p-type isolation layer, and the n-wells and p-wells of the blocking voltage device can be replaced with p-wells and n-wells, respectively. Additionally, the n-type active regions and the p-type active regions can be replaced with p-type active regions and n-type active regions, respectively.

Thus, while illustrated in the context of a p-type semiconductor substrate, the principles and advantages described herein are also applicable to an n-type configuration where the doping polarities are reversed.

Figure 5A:
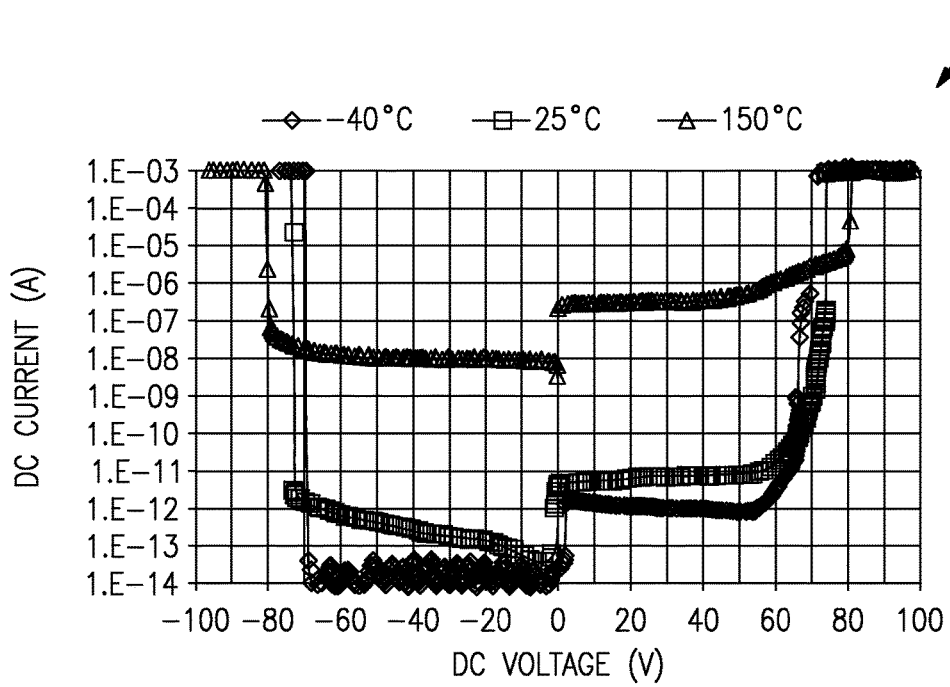
FIG. 5A illustrates a graph of DC current versus DC voltage for one example of a bidirectional clamp that omits an anti-inversion N+ ring structure.

FIG. 5A illustrates a graph 200 of DC current versus DC voltage for one example of a bidirectional clamp that omits an anti-inversion N+ ring structure. The graph 200 corresponds to one implementation of the bidirectional clamp 50 of FIGS. 2A-2C that omits the anti-inversion N+ ring structure 60 in favor of including a continuous shallow trench isolation region.

The graph 200 includes a first plot of DC current versus DC voltage at −40° C., a second plot of DC current versus DC voltage at 25° C., and a third plot of DC current versus DC voltage at 125° C. The graph 200 indicates a forward trigger voltage, a reverse trigger voltage, and leakage current characteristics at each of the three temperatures. The bidirectional clamp associated with the graph 200 can be suitable for providing voltage blocking of ±60V. For example, a worst case forward trigger voltage of about 70 V and a worst case reverse trigger voltage of about −68 V can be observed at −40° C. As shown in FIG. 5A, the bidirectional clamp's leakage current increases at high temperatures.

Figure 5B:
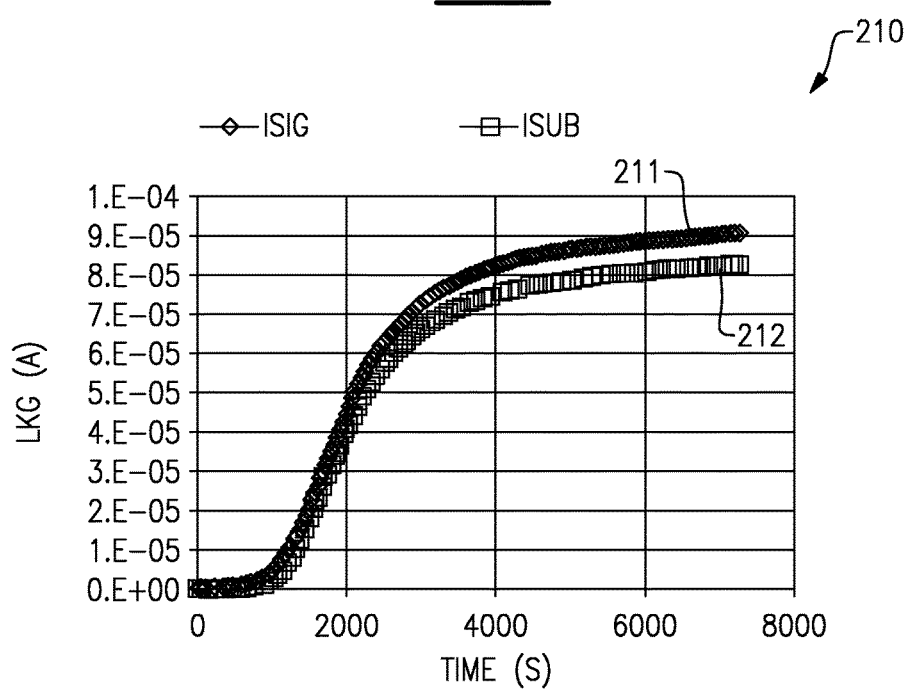
FIG. 5B illustrates a graph of a lifetime test of leakage current for one example of a bidirectional clamp that omits an anti-inversion N+ ring structure.

FIG. 5B illustrates a graph 210 of a lifetime test of leakage current for one example of a bidirectional clamp that omits an anti-inversion N+ ring structure. The graph 200 corresponds to one implementation of the bidirectional clamp 50 of FIGS. 2A-2C that omits the anti-inversion N+ ring structure 60 in favor of including a continuous shallow trench isolation region.

The graph 210 includes a first plot of leakage current of the bidirectional clamp's SIG terminal versus time and a second plot of leakage current of the bidirectional clamp's SUB terminal versus time. The lifetime test was performance for continuous high voltage and high temperature operation, in which a bias voltage of about 60 V was applied between the SIG terminal and the PG terminal at a temperature of about 125° C.

Under these conditions, an upward drift in the leakage current in both SIG terminal and SUB terminal can be observed. For example, the graph 210 illustrates that the leakage current between the SIG terminal and the SUB terminal drifted to about 90 μA when biased at 60V between the SIG and PG terminals and at 125° C. The leakage current drift results from charge-trapping at the interface between STI regions and an n-well, which can result in a parasitic surface PMOS transistor generating a channel-like inversion region through which current can conduct. For example, since the illustrated bidirectional clamp omits the anti-inversion N+ ring structure 60 in favor of including a continuous shallow trench isolation region, the parasitic surface PMOS 35 of FIG. 2B can generate an inversion layer between the first and second p-wells 52a, 52b through which leakage current can conduct.

Figure 6:
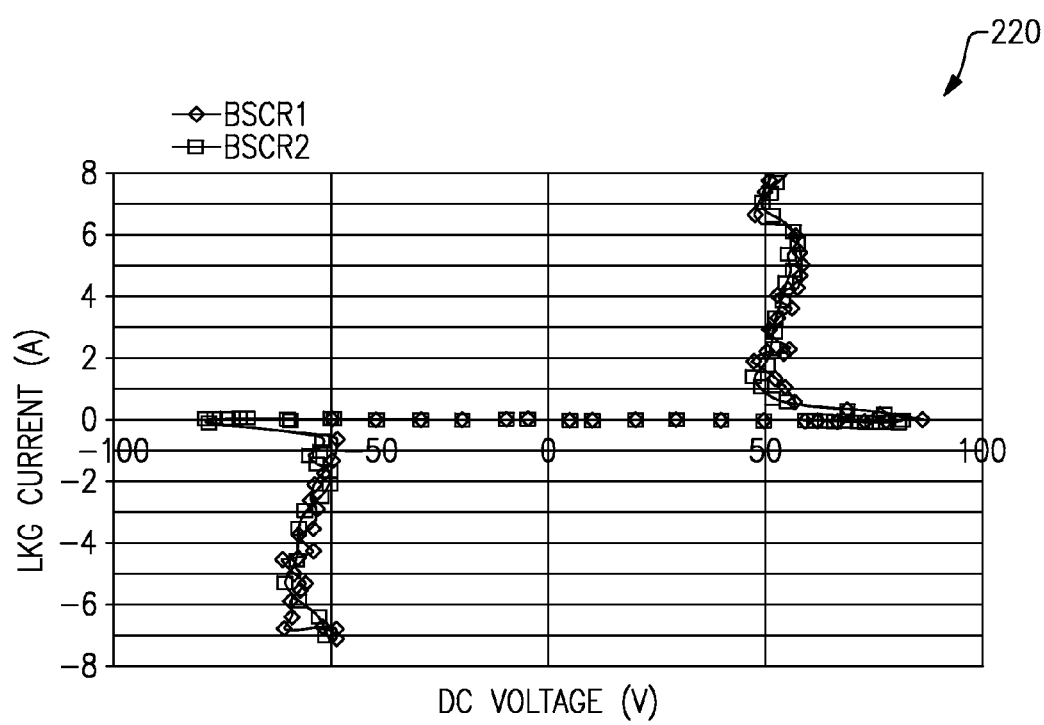
FIG. 6 shows a graph of transmission line pulsing (TLP) laboratory data for two examples of bidirectional clamps.

FIG. 6 shows a graph 220 of transmission line pulsing (TLP) laboratory data for two examples of bidirectional clamps. The graph 220 includes a first plot (BSCR1) of one implementation of the bidirectional clamp 50 of FIGS. 2A-2C without the anti-inversion N+ ring structure 60 and a second plot (BSCR2) of one implementation of the bidirectional clamp 50 of FIGS. 2A-2C with the anti-inversion N+ ring structure 60.

The measurements were taken at about room temperature, and each TLP measurement point can correspond to a voltage and a current measurement obtained by forcing a rectangular 100 ns current pulse having about a 600 ps rise time out of the protection device and measuring the voltage of the protection device between about 40% and about 90% of the current pulse width.

As shown in the graph 220, including the anti-inversion N+ ring structure 60 can have a relatively small impact on the forward and reverse protection characteristics of the bidirectional clamp. For example, both the first plot (BSCR1) and the second plot (BSCR2) exhibit similar forward and reverse protection responses. Thus, a bidirectional clamp that includes an anti-inversion N+ region structure provides robust protection to ESD and/or EMI events.

Additionally, including the anti-inversion N+ ring structure can lower leakage current when the bidirectional clamp is operated continuously in high voltage and/or high temperature conditions. For example, the bidirectional clamp associated with the second plot (BSCR2) includes the anti-inversion N+ ring structure 60, and was observed to have a SIG terminal leakage current of about 35 nA, a SUB terminal leakage current of about 3 nA, and substantially no leakage current drift during life-cycle testing at a high temperature of 125° C. In contrast, the bidirectional clamp associated with the first plot (BSCR1), was observed to have a leakage current similar to that shown in FIG. 5B, which drifts substantially during life-cycle testing.

Applications

Devices employing the above described schemes can be implemented into various high performance electronic devices and interface applications operating in harsh electrical environments, such as interfaces associated with industrial, aeronautic, naval, energy harvesting, and/or automotive applications. Examples of the electronic devices can include, but are not limited to, consumer electronic products, parts of the consumer electronic products, electronic test equipment, high robustness industrial equipment, automotive equipment, etc. The consumer electronic products can include, but are not limited to, an automobile, an engine control unit, a vehicle engine management controller, a transmission controller, a seatbelt controller, an anti-lock brake system controller, etc. Further, the electronic device can include unfinished products, including those for industrial and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A bidirectional clamp for a high voltage interface, the bidirectional clamp comprising:
    a semiconductor substrate;
    a first well region of a first conductivity type in the semiconductor substrate, wherein the first well region comprises a first active region of the first conductivity type and a second active region of a second conductivity type opposite the first conductivity type, wherein the first active region of the first conductivity type, the second active region of the second conductivity type, and the first terminal are electrically connected to form a first node;
    a second well region of the first conductivity type in the semiconductor substrate, wherein the second well region comprises a third active region of the first conductivity type and a fourth active region of the second conductivity type, wherein the third active region of the first conductivity type, the fourth active region of the second conductivity type, and the second terminal are electrically connected to form a second node;
    a third well region of the second conductivity type in the semiconductor substrate, wherein at least a portion of the third well region is positioned between the first well region and the second well region;
    a plurality of oxide regions over the third well region, wherein the plurality of oxide regions and the third well region meet at a plurality of oxide-semiconductor interfaces; and
    an anti-inversion ring structure of the second conductivity type in the third well region, wherein the anti-inversion ring structure is configured to inhibit charge trapping-induced leakage current by interrupting an electrical path from the first well region to the second well region along the plurality of oxide-semiconductor interfaces.

2. The bidirectional clamp of claim 1, wherein the anti-inversion ring structure comprises a first active ring of the second conductivity type, wherein the first active ring surrounds a perimeter of the first well region.

3. The bidirectional clamp of claim 2, wherein the anti-inversion ring structure comprises a second active ring of the second conductivity type, wherein the second active ring surrounds a perimeter of the second well region.

4. The bidirectional clamp of claim 1, wherein the anti-inversion ring structure comprises an active ring of the second conductivity type, wherein the active ring is positioned between the first well region and the second well region.

5. The bidirectional clamp of claim 4,
    wherein the first well region is elongated in a first direction between an upper side and a lower side,
    wherein the second well region is elongated in the first direction between an upper side and a lower side,
    wherein the third active ring is elongated in the first direction and extends beyond the upper sides of the first and second well regions and beyond the lower sides of the first and second well regions.

6. The bidirectional clamp of claim 1, wherein the anti-inversion ring structure is electrically floating.

7. The bidirectional clamp of claim 1,
    wherein the first well region is elongated in a first direction between an upper side and a lower side, wherein the second well region of the first conductivity type is elongated in the first direction between an upper side and a lower side, wherein the anti-inversion ring structure comprises a first leakage current blocking active region of the second conductivity type, wherein the first leakage current blocking active region is elongated in the first direction and extends beyond the upper sides of the first and second well regions and beyond the lower sides of the first and second well regions.

8. The bidirectional clamp of claim 7, further comprising a first shallow well of the second conductivity type in the third well region beneath the first leakage current blocking active region, wherein the first shallow well enhances a carrier concentration of the second conductivity type adjacent a surface of the semiconductor substrate.

9. The bidirectional clamp of claim 7, wherein the anti-inversion ring structure further comprises a second leakage current blocking active region of the second conductivity type, wherein the second leakage current blocking active region is elongated in the first direction and extends beyond the upper sides of the first and second well regions and beyond the lower sides of the first and second well regions, wherein the second leakage current blocking active region and the first leakage current blocking active region are positioned on opposites sides of the first well region.

10. The bidirectional clamp of claim 9, wherein the anti-inversion ring structure further comprises a third leakage current blocking active region of the second conductivity type, wherein the third leakage current blocking active region is elongated in the first direction and extends beyond the upper sides of the first and second well regions and beyond the lower sides of the first and second well regions, wherein the third leakage current blocking active region is positioned between the first and second well regions adjacent to the first leakage current blocking active region.

11. The bidirectional clamp of claim 10, wherein the anti-inversion ring structure further comprises a fourth leakage current blocking active region of the second conductivity type and a fifth leakage current blocking active region of the second conductivity type, wherein the fourth leakage current blocking active region is adjacent to the upper side of the first well region and extends in a second direction substantially perpendicular to the first direction, wherein the fourth leakage current blocking active region intersects the first leakage current blocking active region, the second leakage current blocking active region, and the third leakage current blocking active region, wherein the fifth leakage current blocking active region is adjacent to the lower side of the first well region and extends in the second direction, wherein the fifth leakage current blocking active region intersects the first leakage current blocking active region, the second leakage current blocking active region, and the third leakage current blocking active region.

12. The bidirectional clamp of claim 1, further comprising a first shallow well of the first conductivity type in the first well region beneath the first active region of the first conductivity type, and a second shallow well of the first conductivity type in the first well region beneath the second active region of the first conductivity type.

13. The bidirectional clamp of claim 1, further comprising a fourth well region of the first conductivity type in the semiconductor substrate and surrounding the first well region, the second well region, and the third well region, wherein the fourth well region comprises a third active region of the first conductivity type electrically connected to a third terminal.

14. The bidirectional clamp of claim 1, wherein the first well region, the third well region, and the second well region are configured to operate as a bidirectional bipolar transistor.

15. The bidirectional clamp of claim 1, further comprising a buried layer of the second conductivity type beneath the first well region, the second well region, and the third well region, wherein the semiconductor substrate comprises the first conductivity type.

16. The bidirectional clamp of claim 1, wherein the first conductivity type comprises p-type and the second conductivity type comprises n-type.

17. An integrated circuit comprising:
a semiconductor substrate;
an input port; and
a bidirectional clamp including a first terminal electrically connected to the input port and a second terminal electrically connected to a power low supply voltage, wherein the bidirectional clamp comprises:
a first well region of a first conductivity type in the semiconductor substrate, wherein the first well region comprises a first active region of the first conductivity type and a second active region of a second conductivity type opposite the first conductivity type, wherein the first active region of the first conductivity type, the second active region of the second conductivity type, and the first terminal are electrically connected to form a first node;
a second well region of the first conductivity type in the semiconductor substrate, wherein the second well region comprises a third active region of the first conductivity type and a fourth active region of the second conductivity type, wherein the third active region of the first conductivity type, the fourth active region of the second conductivity type, and the second terminal are electrically connected to form a second node;
a third well region of the second conductivity type in the semiconductor substrate, wherein at least a portion of the third well region is positioned between the first well region and the second well region;
a plurality of oxide regions over the third well region, wherein the plurality of oxide regions and the third well region meet at a plurality of oxide-semiconductor interfaces; and
an anti-inversion ring structure of the second conductivity type in the third well region, wherein the anti-inversion ring structure is configured to inhibit charge trapping-induced leakage current between the input port and the power low supply voltage by interrupting an electrical path from the first well region to the second well region along the plurality of oxide-semiconductor interfaces.

18. The integrated circuit of claim 17, further comprising:
a switching circuit including an input and an output;
a resistor electrically connected between the input port and the input of the switching circuit; and
an amplifier including an input electrically connected to the output of the switching circuit.

19. The integrated circuit of claim 17, wherein the anti-inversion ring structure comprises a first active ring of the second conductivity type, wherein the first active ring surrounds a perimeter of the first well region.

20. The integrated circuit of claim 19, wherein the anti-inversion ring structure comprises a second active ring of the second conductivity type, wherein the second active ring surrounds a perimeter of the second well region.

21. The integrated circuit of claim 17, wherein the anti-inversion ring structure comprises an active ring of the second conductivity type, wherein the active ring is positioned between the first well region and the second well region.

22. A low leakage bidirectional clamp comprising:
a semiconductor substrate;
a first p-type well in the semiconductor substrate, wherein the first p-type well comprises a first p-type active region and a first n-type active region, wherein the first p-type active region, the first n-type active region, and a first terminal are electrically connected to form a first node;
a second p-type well in the semiconductor substrate, wherein the second p-type well comprises a second p-type active region and a second n-type active region, wherein the second p-type active region, the second n-type active region, and a second terminal are electrically connected to form a second node;
an n-type well in the semiconductor substrate, wherein at least a portion of the n-type well is positioned between the first p-type well and the second p-type well;
a plurality of oxide regions over the n-type well, wherein the plurality of oxide regions and the n-type well meet at a plurality of oxide-semiconductor interfaces; and
an n-type anti-inversion ring structure in the n-type well, wherein the n-type anti-inversion ring structure comprises a means for inhibiting charge trapping-induced leakage current by interrupting an electrical path from the first p-type well to the second p-type well along the plurality of oxide-semiconductor interfaces.

* * * * *